(12) United States Patent  (10) Patent No.: US 6,661,474 B2
Hung  (45) Date of Patent: Dec. 9, 2003

(54) THERMAL DISSIPATION STRUCTURE

(75) Inventor: Chien-Ju Hung, Taoyuan (TW)

(73) Assignee: Hannstar Display Corporation, Taipei (TW)

( * ) Notice: Subject to any disclaimer, the term of this patent is extended or adjusted under 35 U.S.C. 154(b) by 73 days.

(21) Appl. No.: 10/020,622

(22) Filed: Oct. 30, 2001

(65) Prior Publication Data

US 2003/0025843 A1 Feb. 6, 2003

(30) Foreign Application Priority Data

Aug. 3, 2001 (TW) ........................... 90213180 U

(51) Int. Cl.[7] ............... H04N 5/64; A47B 81/06
(52) U.S. Cl. ........................ 348/836; 312/7.2
(58) Field of Search ............... 312/7.2, 223.1, 312/223.2, 213, 236; 348/836; 454/184; 361/690, 692; 220/4.02

(56) References Cited

U.S. PATENT DOCUMENTS 4,840,286 A * 6/1989 Heberling et al. ......... 220/4.02
5,730,512 A * 3/1998 Heirich .................... 312/7.2
6,434,011 B1 * 8/2002 Jenkins et al. ............ 361/752

FOREIGN PATENT DOCUMENTS

CA           851612    * 9/1970 .............. 312/7.2

* cited by examiner

Primary Examiner—James O. Hansen
(74) Attorney, Agent, or Firm—J. C. Patents

(57) ABSTRACT

A thermal dissipation structure is suitable for use with a first and second housing members to be assembled with each other. The first and second housing members are provided with a first and second assembly structure, respectively. The first assembly structure includes a first contact surface and the second assembly structure includes a second contact surface. A plurality of recesses are arranged on either the first or second contact surface. The first and second housing members assemble with each other through engaging the first and second assembly structures into each other so that the first contact surface abut against the second contact surface, forming thereby a contact interface between the first and second housing members. The recesses form a plurality of ventilation passageways that communicate with an interior and an exterior of the first and second housing members along the contact interface to dissipate heat.

9 Claims, 9 Drawing Sheets

THERMAL DISSIPATION STRUCTURE

CROSS-REFERENCE TO RELATED APPLICATION

This application claims the priority benefit of Taiwan application serial no. 90213180, filed Aug. 3, 2001.

BACKGROUND OF THE INVENTION

1. Field of Invention

The present invention relates to a thermal dissipation structure. More particularly, the present invention relates to a thermal dissipation structure arranged in the assembly structures of housing members.

2. Description of Related Art

Nowadays, various commercial products including electrical appliances or electronic equipment are fabricated to fit each person's need as much as possible. Additional to being convenient to use, lightweight and compact, variation and aesthetic appeal are also important for the success of these products. However, with respect to electrical products, heat dissipation is a major factor when designing the housing. Conventionally, a series of drilled holes, punched holes or slots are formed in the external surface of the housing to dissipate heat. Products that employ this heat dissipation structure not only have unsightly holes on the housing external surface, but are further difficult to mold and polish.

SUMMARY OF THE INVENTION

Accordingly, an object of the present invention is to provide a thermal dissipation structure arranged in a contact interface between two housing members to be assembled with each other. The thermal dissipation structure of the invention externally appears as a plurality of clearances along the contact interface between the two housing members assembled with each other so that the conventional thermal dissipation holes in the external surface of the housing members are no longer necessary. The aesthetic aspect of the housing can be thereby improved while heat dissipation is effectively achieved.

To achieve these and other advantages and in accordance with the purpose of the invention, as embodied and broadly described herein, the invention provides a thermal dissipation structure suitable for use with a first and second housing members to be assembled with each other. The first housing member is provided with a first assembly structure and the second housing member is provided with a second assembly structure. The first assembly structure includes a first contact surface and the second assembly structure includes a second contact surface. A plurality of recesses are arranged on either the first or second contact surface. The first and second housing members are assembled with each other by engaging the first and second assembly structures into each other so that the first contact surface abut against the second contact surface, forming thereby a contact interface between the first and second housing members. The recesses form a plurality of ventilation passageways that communicate with an interior and an exterior of the first and second housing members along the contact interface to dissipate heat.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
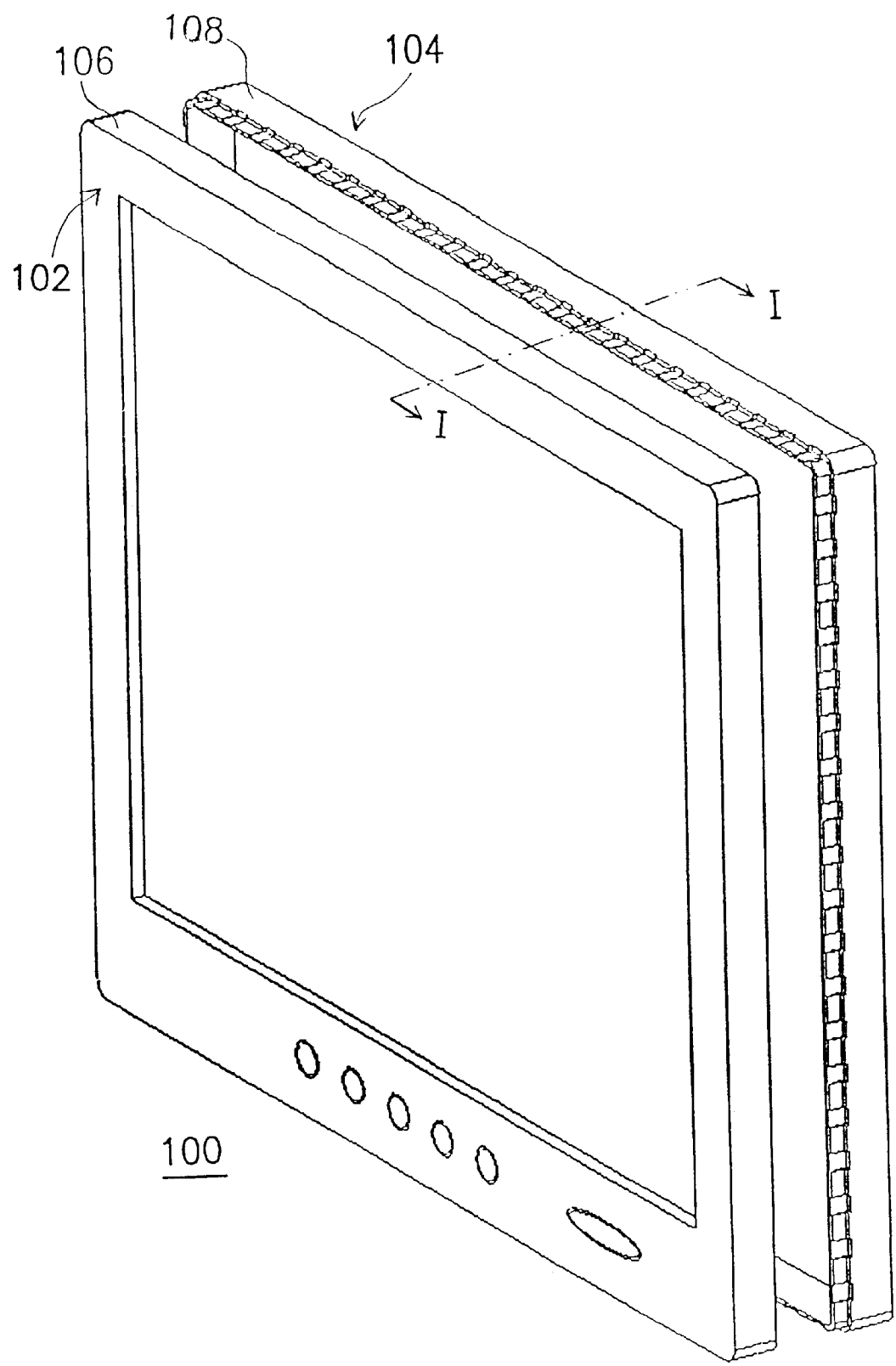
FIG. 1 is a perspective view showing a thermal dissipation structure used with the housing of a liquid crystal display device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts unless otherwise illustrated.

The invention provides a thermal dissipation structure suitable for use with various types of electrical products. Typically, electrical products have a plastic or metal housing that externally encloses the electrical product. The housing further should be able to effectively dissipate heat. In the following description, the example of a housing for liquid crystal display device is depicted to illustrate the thermal dissipation structure of the invention. However, this should not be construed in a way that would restrict the application of the invention to the following description alone.

Figure 2:
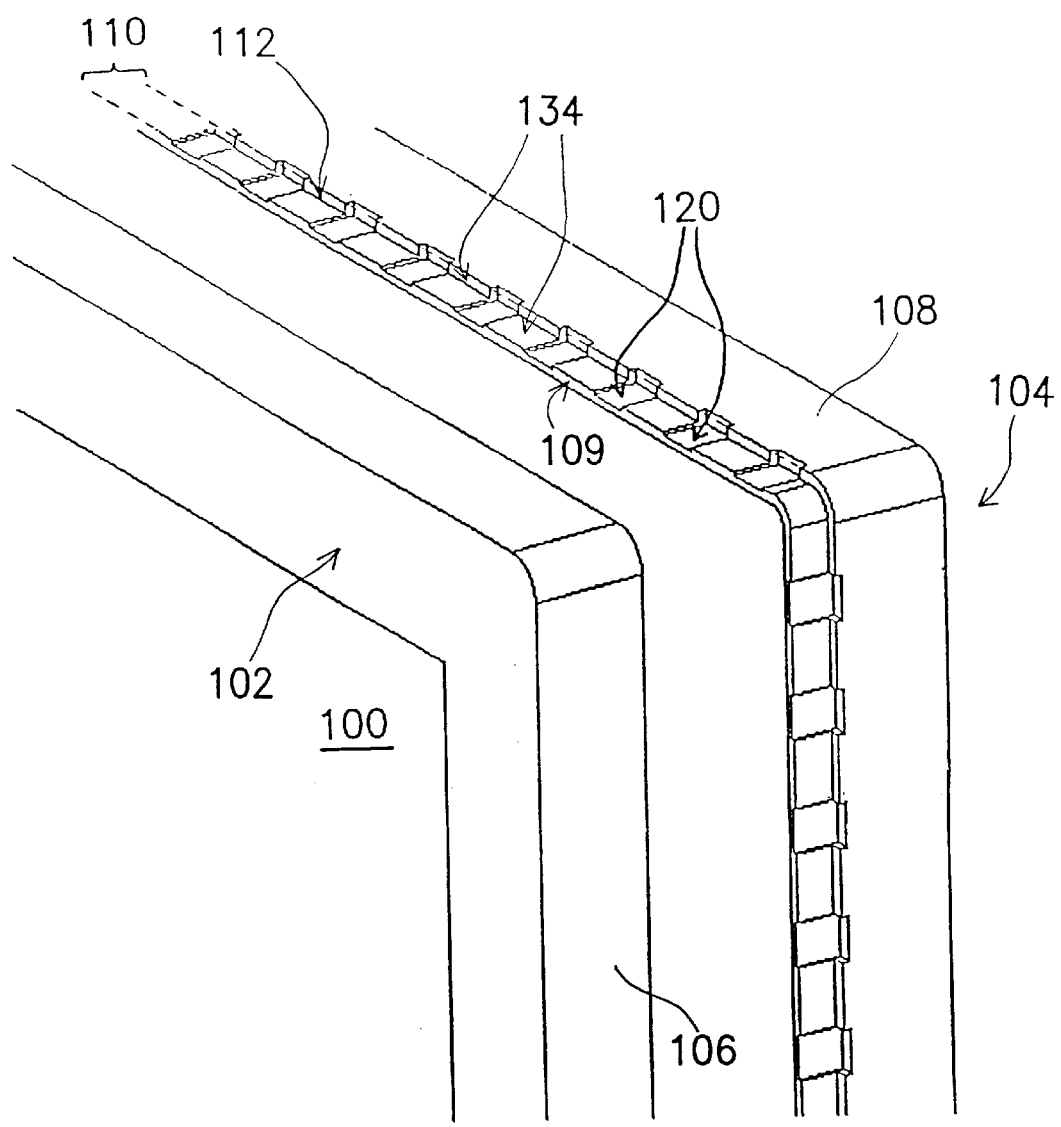
FIG. 2 is an enlarged view of a portion of FIG. 1.
Figure 3:
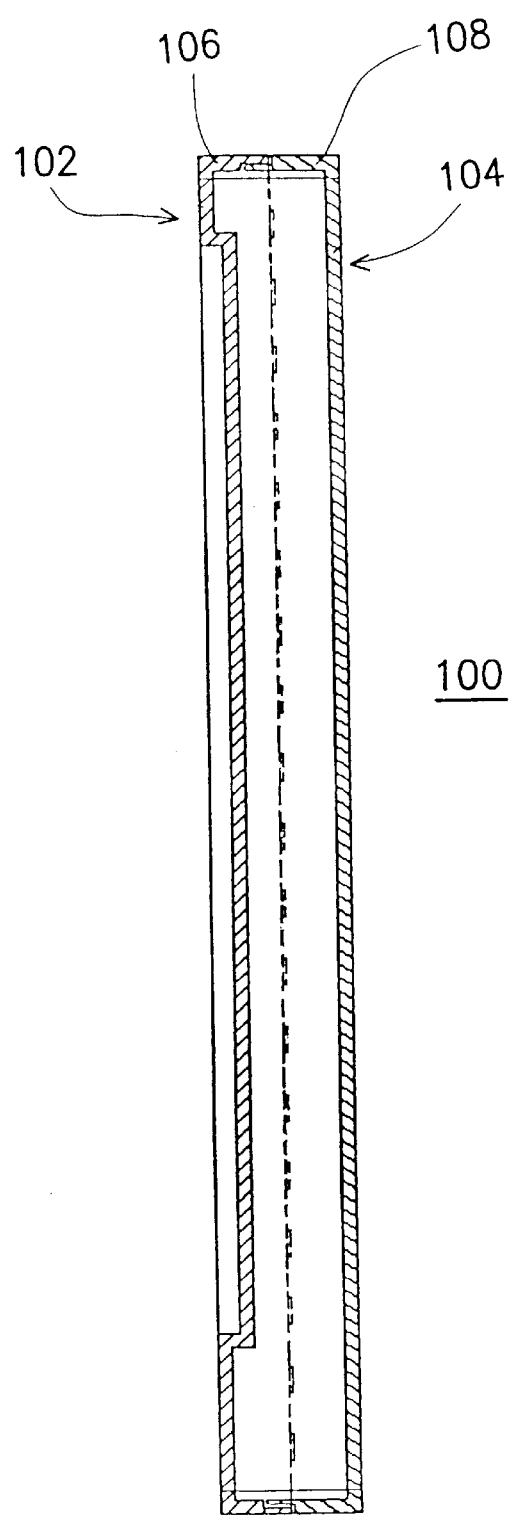
FIG. 3 is a cross-sectional view taken along the section I of FIG. 1 schematically showing the thermal dissipation structure according to an embodiment of this invention.
Figure 4:
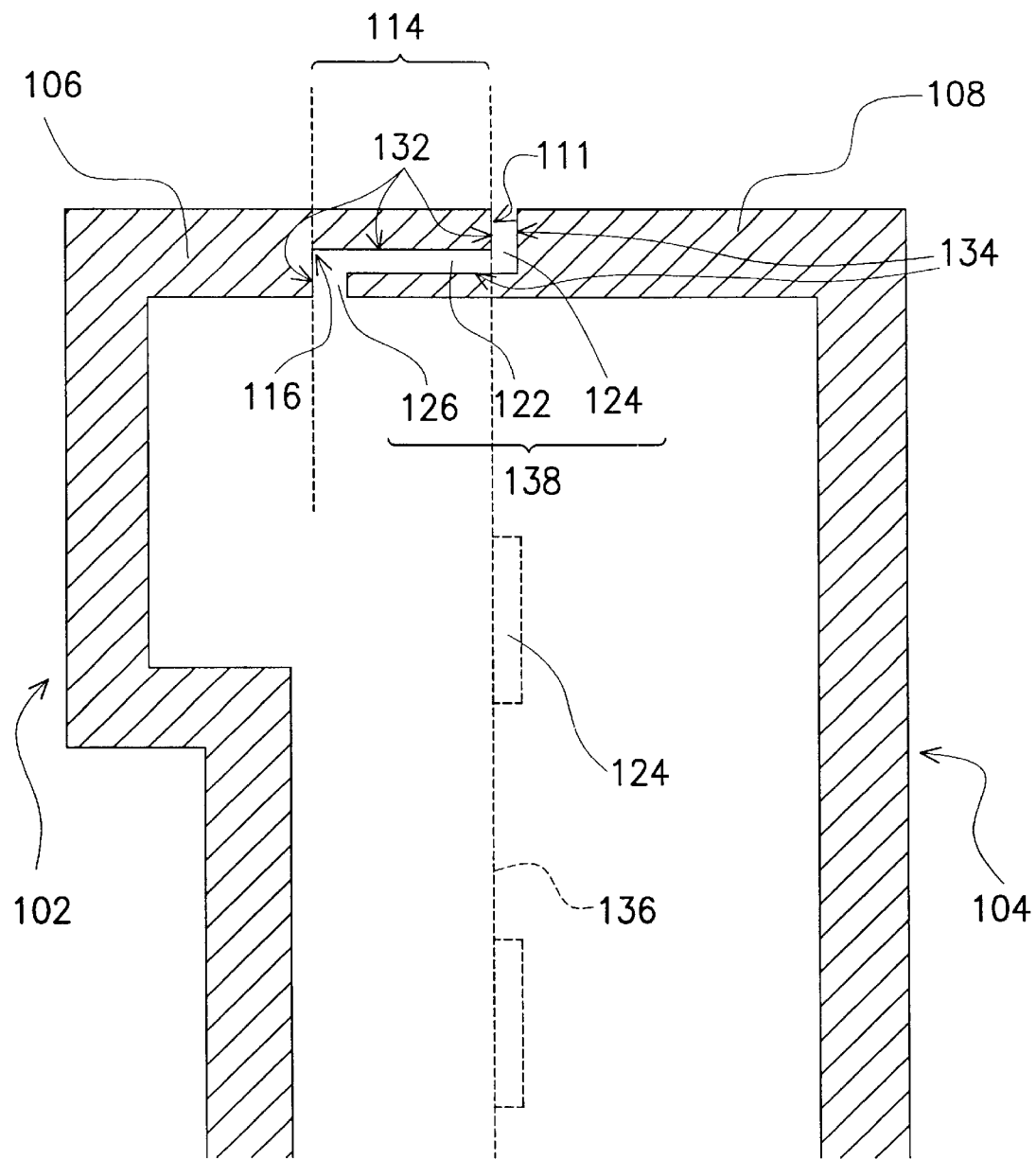
FIG. 4 is an enlarged view of a portion of FIG. 3.

Reference is now made to FIG. 1 through FIG. 4 to describe the thermal dissipation structure according to an embodiment of the invention. FIG. 1 is a perspective view schematically showing a housing for liquid crystal display device provided with a thermal dissipation structure according to an embodiment of this invention. FIG. 2 is a locally enlarged view of FIG. 1. FIG. 3 is a cross-sectional view taken along the section I—I of FIG. 1 showing the thermal dissipation structure according to the embodiment of this invention. FIG. 4 is a locally enlarged view of a portion of FIG. 3.

Typically, the external housing of a liquid crystal display 100 includes a front housing 102 and a back housing 104. The front housing 102 encloses a liquid crystal display module (LCM) but exposes the display screen of the LCM, the front housing 102 and the crystal display module (LCM) hence form a liquid crystal main body. The back housing 104 encloses the backside of the LCM (not shown). Although a liquid crystal display device usually consumes a moderately low amount of power, heat generated must still be dissipated.

Referring to FIG. 2 and FIG. 4, a sidewall 106 of the front housing 102 and a sidewall 108 of the back housing 104 respectively terminate into assembly structures 110, 114 through which the front housing 102 and the back housing 104 assemble with each other. Various designs for the assembly structures 110, 114 can be envisaged to enable the assembly structures 110, 114 to engage into each other for attaching the front and back housings 102, 104. In the present embodiment, the sidewalls 106, 108 may respectively terminate into, for example, shoulders 112, 116. With respect to the back housing 104, the two surfaces of the shoulder 112 that are oriented to the exterior of the back housing 104 form a contact surface 134. The contact surface 134 may include other surfaces such as the edge 109, for example. With respect to the front housing 102, the edge 111 and the two surfaces of the shoulder 116 that are oriented to the interior of the front housing 102 form a contact surface 132. A plurality of slots 120 are further recessed from the contact surface 134 of the assembly structure 114. The slots 120 may be recessed from, for example, the two surfaces of the shoulder 112.

To assemble the front housing 102 with the back housing 104, the assembly structures 110, 114 engage parallel with each other so that their respective contact surfaces 132, 134 effectively contact with each other. However, the assembly structures 110, 114 are designed in such a manner that the edge 109 does not abut against the shoulder 116 of the assembly structure 114, forming thereby a clearance 126 that communicates with the interior of the assembled housings 102, 104. Being in contact with each other, the contact surfaces 132, 134 define a contact interface 136 between the front housing 102 and back housing 104. More particularly in the example of this embodiment, the contact interface 136 includes the edge 111, one surface of the shoulder 116, and two surfaces of the shoulder 112. With the arrangement of the slots 120 in the contact surface 134, the contact interface 136 is locally interrupted by clearances 122, 124 along the contact interface 136. The clearances 122, 124, 126 communicating with one another hence provide a plurality of ventilation passageways 138 to effectively dissipate heat.

Figure 5:
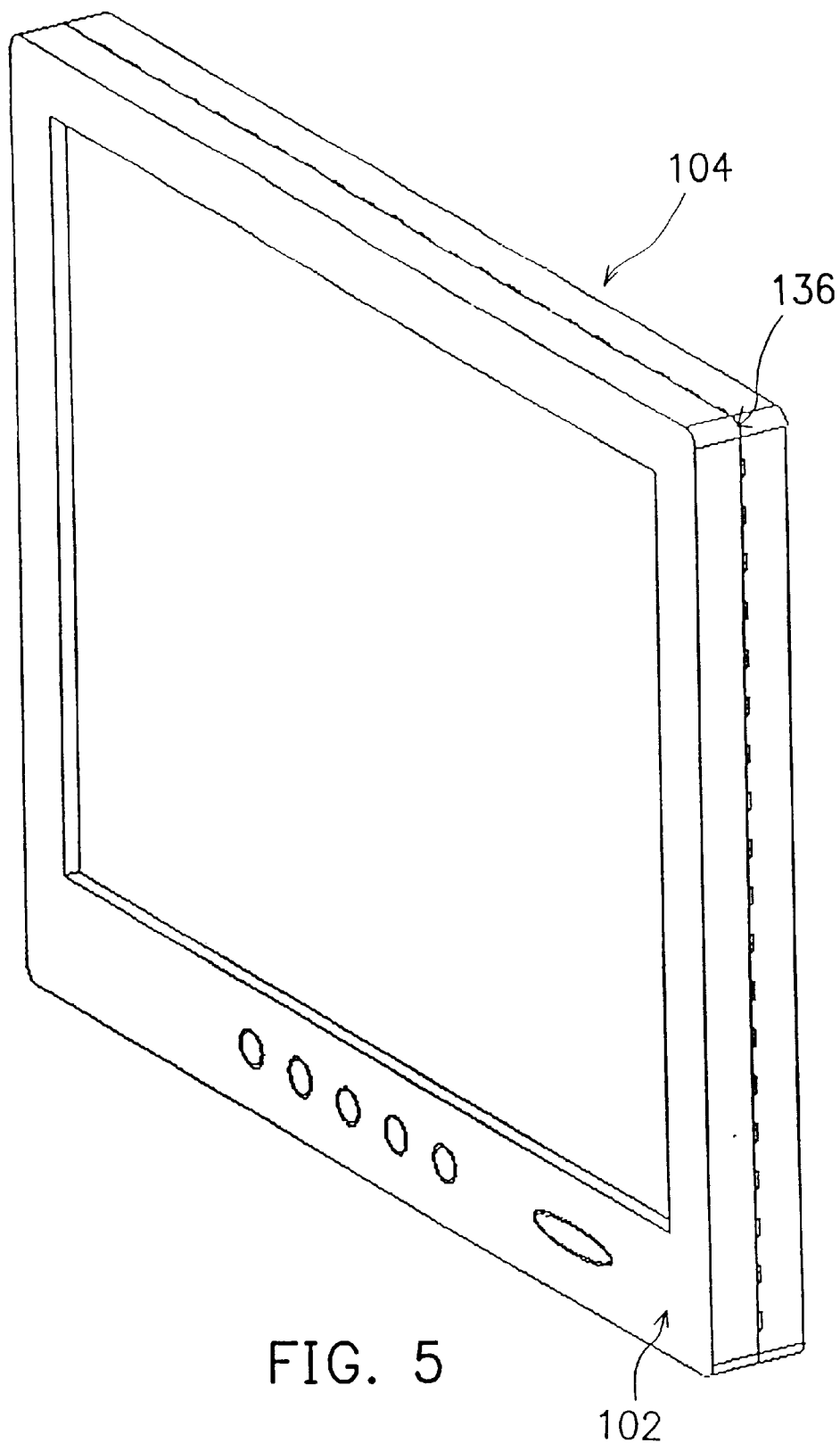
FIG. 5 is a perspective view showing the external appearance of a housing provided with a thermal dissipation structure of the invention.
Figure 6:
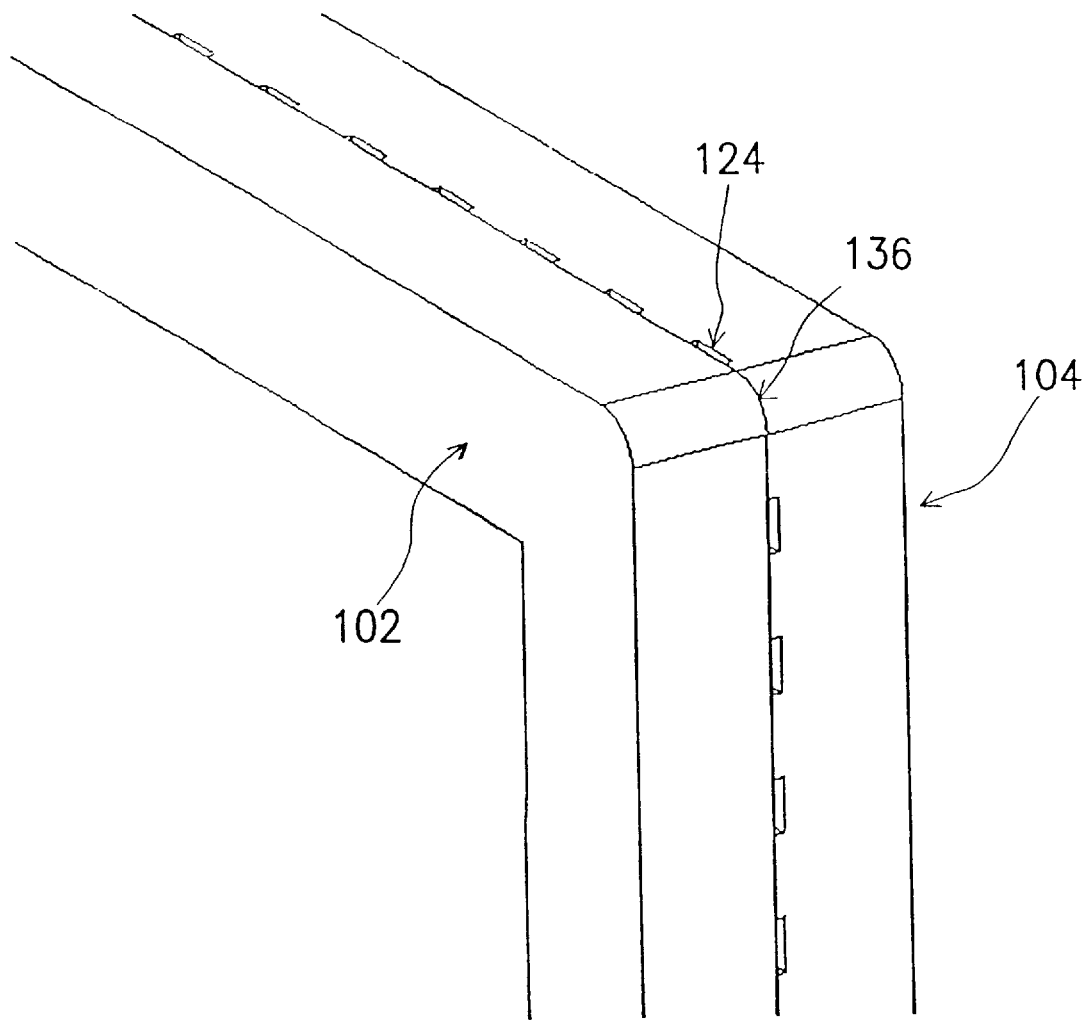
FIG. 6 is an enlarged view of a portion of FIG. 5.

Referring now to FIG. 5 and FIG. 6, a general perspective view and a locally enlarged view schematically show the external aspect of a LCD device provided with a thermal dissipation structure according to the embodiment of the invention. As illustrated in FIG. 5 and FIG. 6, the thermal dissipation structure of the invention is externally visible only through the clearances 124 of the ventilation passageways 138 along the contact interface 136 between the front housing 102 and back housing 104. With the thermal dissipation structure of the invention arranged in the assembly structures 110, 114 of the housings 102, 104, the conventional thermal dissipation slots on the external surface of the back housing 104 are therefore no longer necessary. As a result, the external appearance of the back housing 104 is more aesthetic and various ornamental features may be further formed on the external surface of the back housing 104, for example.

As illustrated in the above description, the thermal dissipation structure of 20 the invention principally comprises the formation of ventilation passageways within the contact interface (136) between the housing members (front housing 102 and back housing 104) assembled with each other. Heat dissipation can be effectively performed through the ventilation passageways. More particularly, the above embodiment shows that the thermal dissipation structure may be achieved via the arrangement of various recess structures such as slots (120) in the contact surfaces of the assembly structures (110, 114) of the housing members. When the assembly structures engage with each other to mutually attach the housing members, the recess structures form communicating clearances (122, 124, 126) along the contact interface between the housing members assembled to each other. The clearances that communicate with one another form the ventilation passageways for thermal dissipation. The recess structures such as slots may be simply formed with the molding of the housing parts to form the ventilation passageways, and their arrangement may be various as described hereafter with reference to FIG. 7 through FIG. 11.

Figure 7:
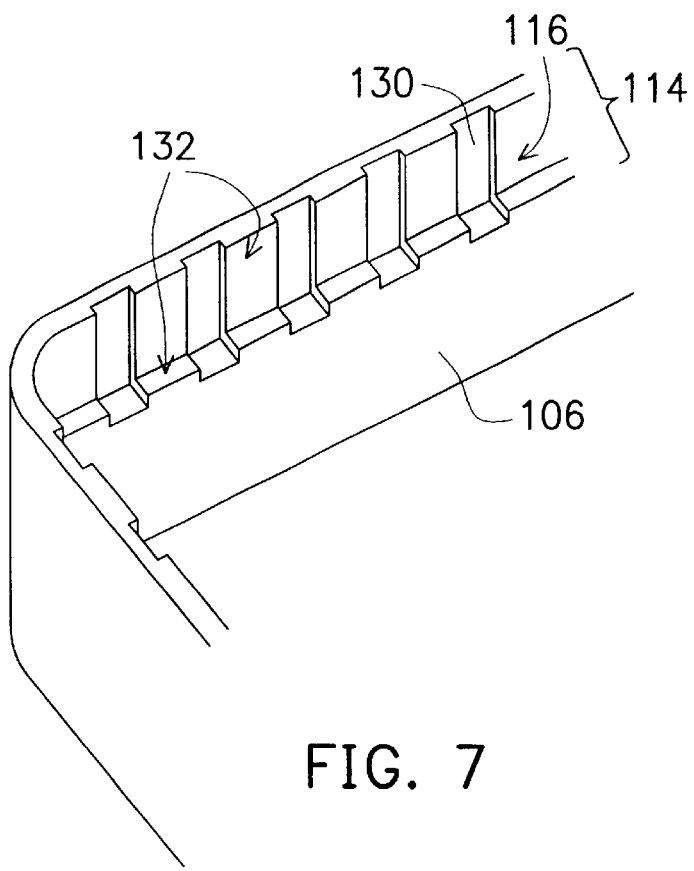
FIG. 7 through FIG. 11 are perspective views schematically showing various examples of a thermal dissipation structure according to the invention
Figure 8:
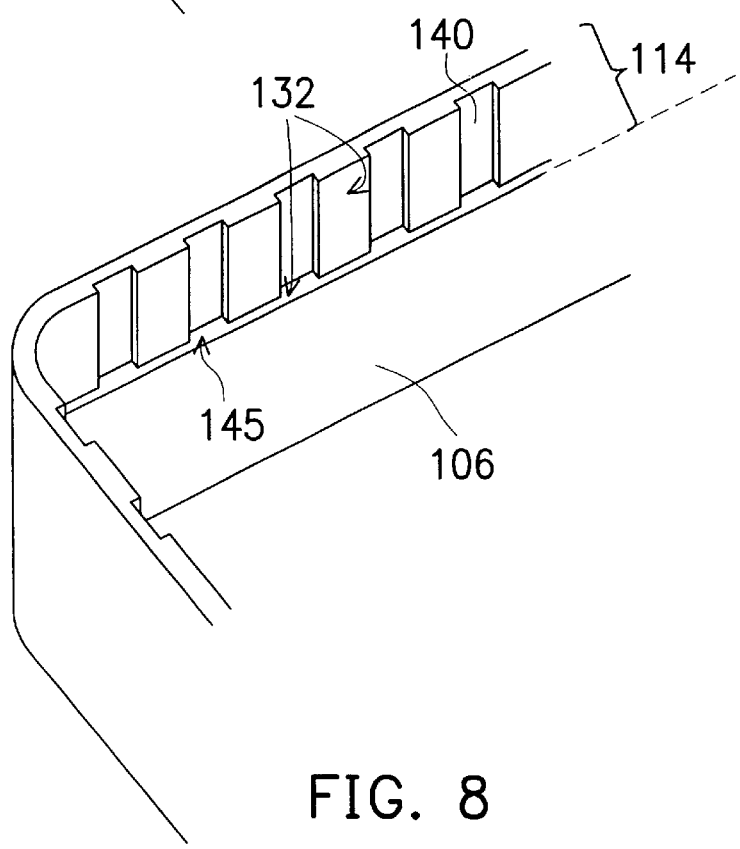

Referring to FIG. 7 and FIG. 8, two enlarged views of the front housing 102 schematically illustrate other variant structures for thermal dissipation according to other examples of the invention. As illustrated in FIG. 7 and FIG. 8, the assembly structure 114 of the front housing, 102, similar to the previous embodiment, may comprise a shoulder 116, wherein the shoulder 116 includes a plurality of surfaces that support the contact surface 132 of the assembly structure 114. Additionally, a plurality of slots 140 may be recessed from the contact surface 132. FIG. 7 shows an example wherein the slots 140 recess from two surfaces of the shoulder 116, and FIG. 8 shows another example wherein the slots 140 recess from only one surface of the shoulder 116. The assembly structure 114 of either FIG. 7 or FIG. 8 can assemble with the assembly structure 110 of FIG. 2 to form the ventilation passageways 138 along the contact interface 136 (see FIG. 4), wherein the assembly structure 110 may be with or without the slots 120. If both assembly structures 110, 114 include the slots 120, 140, the slots 120, 140 should be aligned with one another so that heat dissipation can be achieved with larger ventilation passageways 138.

With the assembly structure 114 of FIG. 7 assembled with the assembly structure 110, the edge 109 may either abut or not abut against the shoulder 116 to form the clearance 126 (see FIG. 4) communicating with the interior of the housings 102, 104.

With the assembly structure 114 of FIG. 8 assembled with the assembly structure 110, the clearance 126 may be formed via spacing apart the edge 109 (see FIG. 2) and the surface 145 of the shoulder 116.

Figure 9:
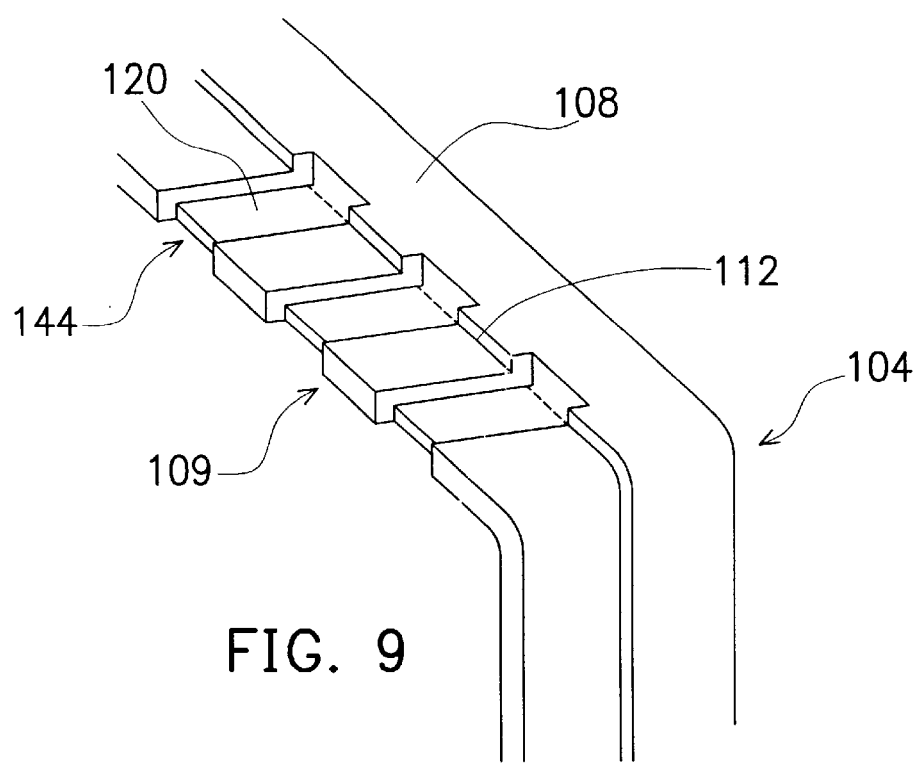

FIG. 9 illustrates another example of construction wherein the assembly structure 110 of the back housing 104 may be further provided with a plurality of slots 144 recessed from the edge 109 at the location of the slots 120 to form the clearance 126 (see FIG. 4).

Figure 10:
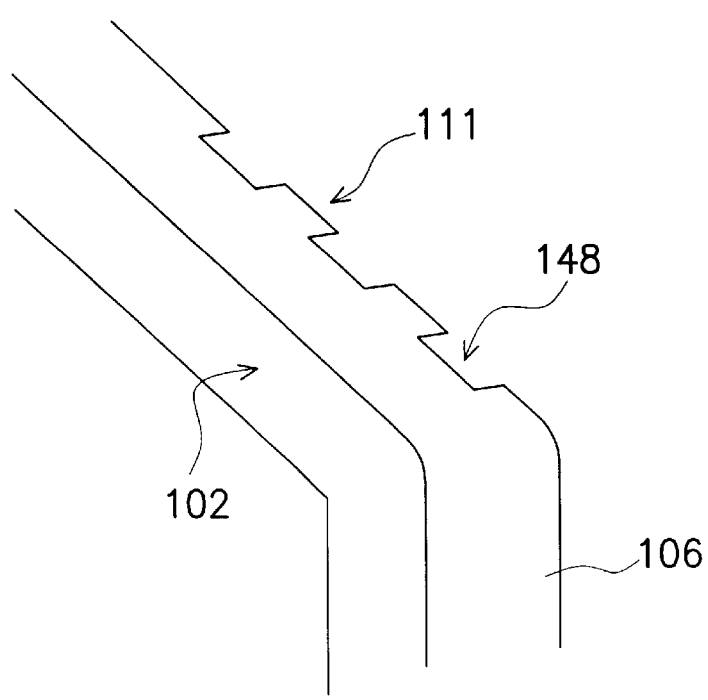
Figure 11:
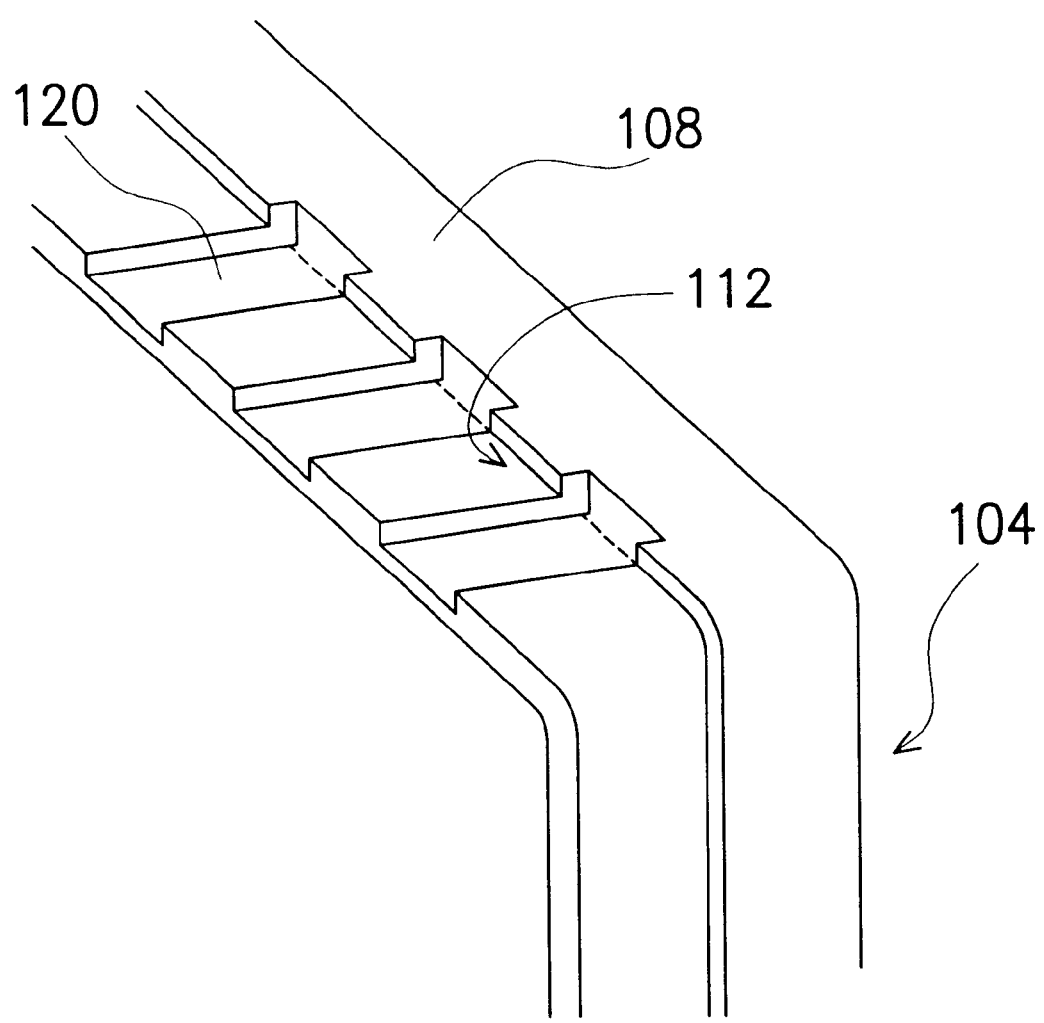

FIG. 10 further illustrates another example of construction wherein a plurality of indentations 148 may be provided on the edge 111 of the assembly structure 114 of the front housing 102 to form the clearance 124 (see FIG. 4) communicating with the exterior of the housings 102, 104. The front housing 102 of FIG. 10 may be assembled with, for example, the back housing 104 shown in FIG. 11.

In summary, the thermal dissipation structure of the invention includes an adequate design of the assembly structures of device housing members so that once the housing members assemble with one another, a plurality of ventilation passageways are formed in the contact interface between the housing members. The ventilation passageways may be formed by, for example, arranging recess structures on the contact surfaces of the assembly structures of the housing members. The recess structures may be formed with, for example, a molding of the housing members. Effective thermal dissipation can be thereby achieved through the housing members without additional thermal dissipation slots/holes conventionally provided on the external surfaces of the housing members. As a result, the aesthetic aspect of the housing can be favorably improved.

It would be apparent to the skilled artisan that the above description of embodiments and examples is only illustrative of specific ways to implement the present invention. For example, it would be apparent to the skilled artisan that the above-described assembly structures 110, 114 are only particular examples of assembly structures, and other assembly structures would be adequate for providing the ventilation passageways along the contact interface such as disclosed in the invention. Besides, the above-description refers particularly refers to a LCD housing. It would be apparent to the skilled artisan that the thermal dissipation structure of the invention may be adequate for other device housing.

What is claimed is:

1. A thermal dissipation structure suitable for use with a first housing member and a second housing member to be assembled with each other, the thermal dissipation structure comprising:

a first assembly structure formed on the first housing member, wherein the first assembly structure includes a first shoulder structure having a first contact surface, and a plurality of first slots that are further recessed from the first contact surface of the first shoulder structure; and a second assembly structure formed on the second housing member, wherein the second assembly structure includes a second shoulder structure having a second contact surface, wherein the first housing member and the second housing member are assembled to each other by engaging the first assembly structure and the second assembly structure into each other so that the first contact surface and the second contact surface abut against each other to form a contact interface between the first and second housing members, wherein an edge of the first assembly structure does not abut against the second contact surface of the second assembly structure thereby forming a first clearance, wherein a plurality of second clearances are formed between the first slots and the second contact surface of the second assembly structure, wherein through the first clearance and the second clearances between the first slots and the second contact surface, a plurality of ventilation passageways that communicate with an interior and an exterior of the first and second housing members are formed along the contact interface to dissipate heat.

2. The thermal dissipation structure of claim 1, wherein the ventilation passageways eternally appear as a plurality of third clearances along the contact interface when the first housing member and the second housing member assemble with each other.

3. The thermal dissipation structure of claim 1, wherein the first and second housing members are formed by molding.

4. The thermal dissipation structure of claim 3, wherein the first and second assembly structures are formed with the molding of the first and second housing members.

5. A thermal dissipation structure suitable for use with a first housing member and a second housing member to be assembled with each other, the thermal dissipation structure comprising:

a first assembly structure on the first housing member, wherein the first assembly structure includes a first contact surface, and a plurality of first recesses that are recessed further from the first contact surface;

a second assembly structure on the second housing member, the second assembly structure includes a second contact surface, wherein the first housing member and the second housing member are assembled with each other by engaging the first assembly structure and the second assembly structure into each other so that the first contact surface and the second contact surface abut against each other to form a contact interface between the first housing member and the second housing member, wherein an edge of the first assembly structure does not abut against the second contact surface of the second assembly structure thereby forming a first clearance, wherein a plurality of second clearances are formed between the first recesses and the second contact surface of the second assembly structure wherein through the first clearance and the second clearances between the first recesses and the second contact surface, a plurality of ventilation passageways that communicate with an interior and an exterior of the first and second housing members are formed along the contact interface to dissipate heat.

6. The thermal dissipation structure of claim 5, wherein the ventilation passageways externally appear as a plurality of third clearances along the contact interface when the first and second housing members are assembled to each other.

7. The thermal dissipation structure of claim 5, wherein the shape of the recesses includes a slot shape.

8. The thermal dissipation structure of claim 5, wherein the first and second housing members are formed by molding.

9. The thermal dissipation structure of claim 8, wherein the first and second assembly structures are formed with the molding of the first and second housing members.

* * * * *